United States Patent [19]
Akaogi et al.

[11] Patent Number: 4,802,127
[45] Date of Patent: Jan. 31, 1989

[54] OUTPUT BUFFER CIRCUIT FOR A SEMICONDUCTOR MEMORY DEVICE

[75] Inventors: Takao Akaogi, Kawasaki; Takeo Tatematsu, Yokohama, both of Japan

[73] Assignee: Fujitsu Limited, Kanagawa, Japan

[21] Appl. No.: 196,772

[22] Filed: May 18, 1988

Related U.S. Application Data

[63] Continuation of Ser. No. 839,260, Mar. 13, 1986, abandoned.

[30] Foreign Application Priority Data

Mar. 14, 1985 [JP] Japan .................................. 60-49350
Mar. 20, 1985 [JP] Japan .................................. 60-54666

[51] Int. Cl.[4] .............................................. G11C 7/00
[52] U.S. Cl. ..................................... 365/189; 365/194
[58] Field of Search ....................... 365/189, 194, 230; 307/475

[56] References Cited

U.S. PATENT DOCUMENTS

| | | | |
|---|---|---|---|
| 4,532,613 | 7/1985 | Takemae et al. | 365/230 |
| 4,583,204 | 4/1986 | Takemae et al. | 365/189 |
| 4,661,928 | 4/1987 | Yasuoka | 365/189 |

Primary Examiner—James W. Moffitt
Attorney, Agent, or Firm—Armstrong, Nikaido, Marmelstein & Kubovcik

[57] ABSTRACT

A semiconductor memory device of multi-bit type which produces plural output signals corresponding to read-out data from one address at a time including memory device for storing data. In a plurality of output buffer stages for producing the output signals, the operation of the output buffer stages is based upon at least a timing signal. A device for operating the output buffer stages have predetermined time differences. The output signals having predetermined time differences are delivered from the output buffer stages.

3 Claims, 8 Drawing Sheets

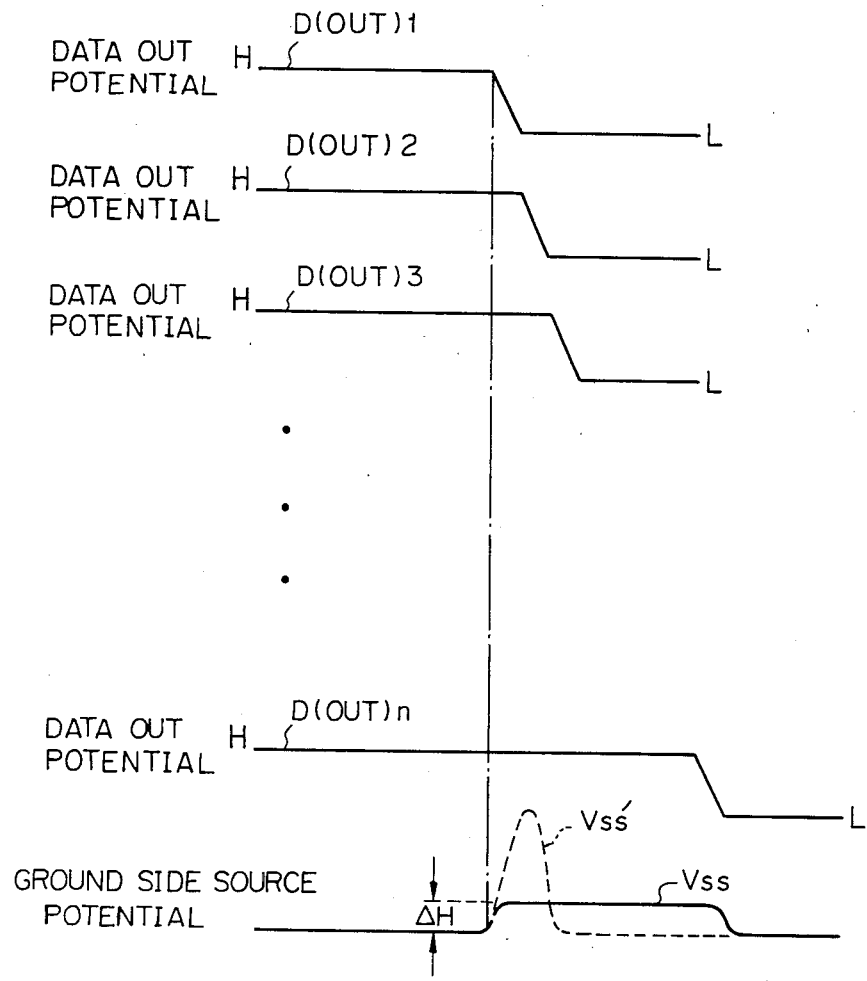

| Fig. 6 A | Fig. 6 B |

OUTPUT BUFFER CIRCUIT FOR A SEMICONDUCTOR MEMORY DEVICE

This application is a continuation of application Ser. No. 839,260 filed Mar. 13, 1986, now abandoned.

BACKGROUND OF THE INVENTION

1. Field of the Invention

The present invention relates to a semiconductor memory device. More particularly, it relates to a semiconductor memory device having a multi-bit constitution, in which the output buffer stages are driven by each sequential output of the delay control means. Sequential time-delayed signals are output by the output buffer stage to prevent a rush current from flowing at the beginning of the data output and to eliminate a malfunction in a memory device and associated circuits thereof.

2. Description of the Related Art

In a known semiconductor memory device such as a dynamic RAM having multi-bit output stages constituted by, e.g., 16K×4 bits or 8K×8 bits, when data is transmitted at the output stage, large capacitive loads in an exterior data bus line are simultaneously charged or discharged immediately after commencing the transmission of the data output. As a result, a large current flows through a line from the positive side power source line to the output terminal or through a line from the output terminal to the ground side power source line during the period in which the output is changed from a low level to a high level, or vice versa. This excessive transient current is likely to cause a fluctuation of the potential at the positive side power source line or at the ground side source line. The fluctuation is due to insufficient capacity of the power source and parasitic resistance of the power source line, and thus causes a malfunction in the semicondutor memory device itself or in its associated circuits.

In particular, the fluctuation of the potential along the ground side power source line is undesirable to avoid malfunctions because this line is usually used as a reference potential line which determines the logic levels of signals. This problem is serious in memory devices of multi-bit type which generates plural output data signals each time in response to address signals for one address.

While the large transient current should be avoided to eliminate the malfunction as stated above, the output buffers contained in the device for generating the data outputs should have sufficient ability of driving external lines for fast read-out operation, resulting in undesirable amount of potential fluctuation along the power source lines particularly when all the data output each time has the same polarity.

SUMMARY OF THE INVENTION

An object of the present invention is to provide a semiconductor memory device including a plurality of output buffer stages to reduce malfunctions of the memory circuit and associated circuits thereof, by eliminating the multiplication of the transient current by those output stages which would otherwise cause a significant rise in the potential level of the power source line.

According to the fundamental aspect of the present invention, there is provided a semiconductor memory device of a multi-bit type which produces plural output signals corresponding to readout data from one address at a time, including a memory for storing data; a plurality of output buffer stages for producing the output signals, the operation of the output buffer stages being based upon at least a timing signal; and a device for operating the output buffer stages with predetermined time differences. The output signals having predetermined time differences are delivered from the output buffer stages.

BRIEF DESCRIPTION OF THE DRAWINGS

FIG. 2 shows the transition of the potential level of data output in the data output terminals and the potential level of the ground side power source $V_{SS}$;

DESCRIPTION OF THE PREFERRED EMBODIMENT

Figure 1A:
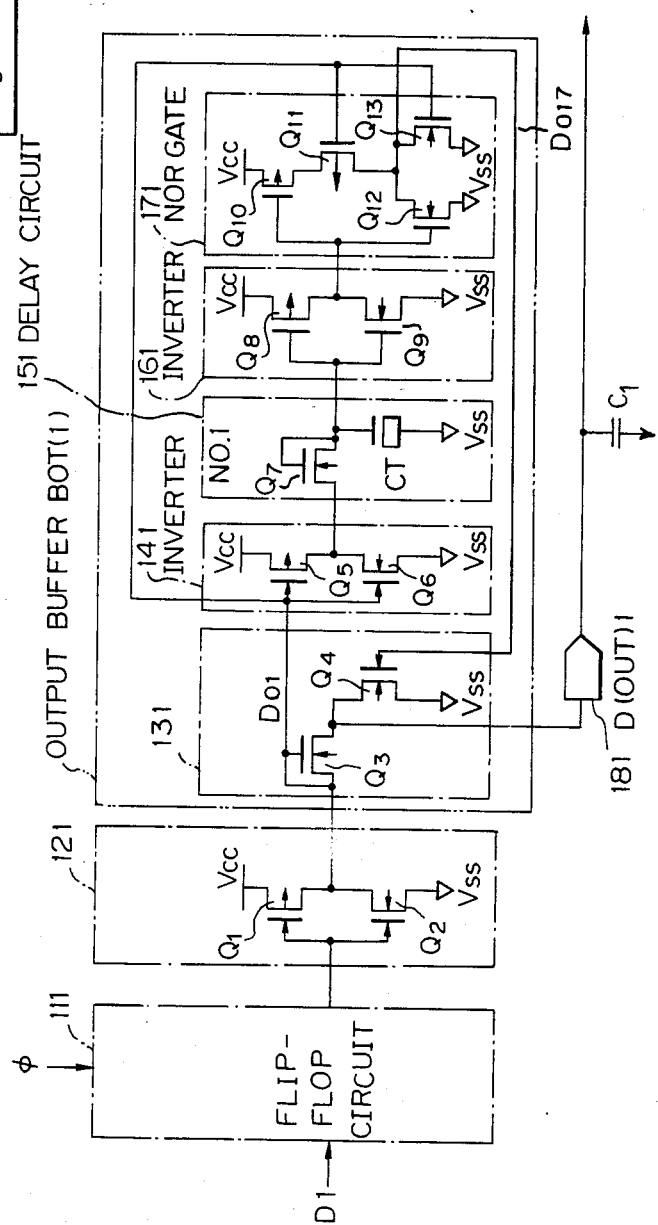
FIGS. 1A and 1B are a block diagram of a semiconductor memory device according to an embodiment of the present invention.
Figure 1B:
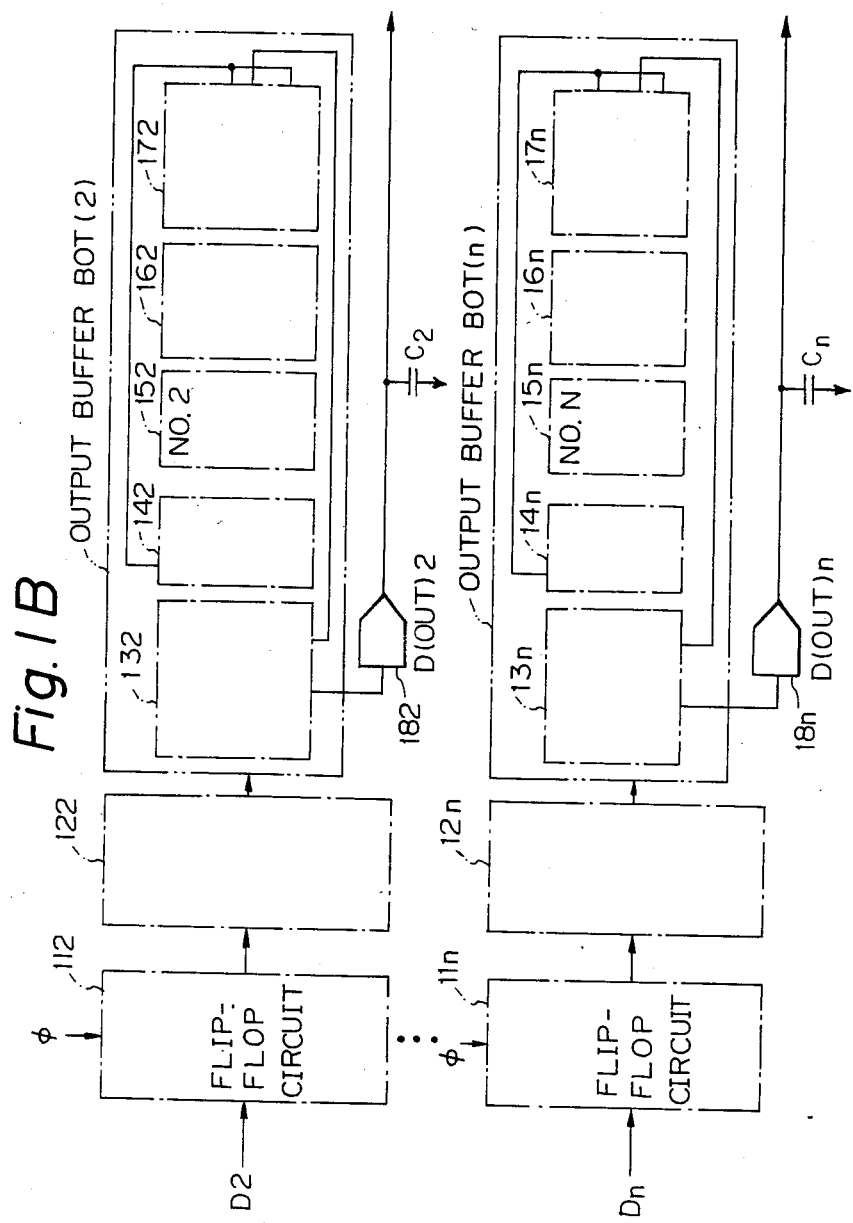

FIGS. 1A and 1B are a schematic block diagram of a semiconductor memory device according to an embodiment of the present invention.

In FIG. 1A, a driving means is shown where 111 denotes a flip-flop circuit, and 121 an output stage in the form of an inverter. BOT(1), BOT(2), . . . BOT(n) denote output buffer circuits.

In the output buffer circuit BOT(1), 131 denotes an output switching circuit, 141 an inverter, 151 a delay circuit, 161 an inverter and 171 a NOR gate. Reference numeral 181 denotes a data output terminal. Q1, Q2, Q5, Q6 and Q8, Q9 are pairs of transistors each constituting an inverter, respectively; Q3 is an output switching transistor; Q4 a charge discharging switching transistor; Q7 a transistor forming part of a delay circuit; and Q10, Q11, Q12, and Q13 are transistors forming a NOR gate. CT is part of the MOS type capacitor forming a delay circuit. D(OUT)1 to D(OUT)n are data output terminals for each output buffer BOT(1) to BOT(n).

FIG. 2 is a diagram showing the transition of the potential level of data output in the data output terminals D(OUT)1 to D(OUT)n and the potential level of the ground side power source $V_{SS}$.

In FIG. 2, due to the action of the output buffer circuit BOT(1) as shown in FIG. 1A, the charges stored by each capacitor C (i.e. $C_1, C_2, \ldots C_n$) in each exterior circuit are discharged successively, and accordingly, the potential level of data output terminal D(OUT)1 to D(OUT)n falls to "L" with a time shift. As the charge stored in each capacitor does not flow at the same time, it can be seen that only the potential level of the $V_{SS}$ side power source line rises slowly to ΔH.

The flip-flop 111 storing data D1 read out from the memory cell array sends an output caused by a trigger pulse φ to an output stage 121. Similarly, other flip-flop circuits 112, 113, . . . 11n storing data D2, D3, . . . Dn send outputs at the same time by the trigger pulse φ to the corresponding output stages 122, 123, . . . 12n. When the data output from the output stage 121 changes from "L" to "H", each switching transistor Q1 and Q3 is ON. Thus, an "H" potential level is output from the output terminals D(OUT)1 to D(OUT)n and each capacitor $C_1$-$C_m$ is charged. In this case the delay action is not effected by the output buffer circuit BOT(1).

When the data output from the output stage 121 changes from "H" to "L", the switching transistor Q2 is ON and the transistor Q3 is OFF, and accordingly, the charge charged in the capacitor C does not flow through the transistor Q2 in the output stage 121 to the $V_{SS}$ side power source line.

The data output $D_{01}$ from the output stage 121 is made "H" through an inverter 141 formed by transistors Q5 and Q6, and applied to the delay circuit 151.

In the delay circuit 151, the transistor Q7 is a depletion type and acts as a constant current source, rendering a constant current flow by degrees to a MOS capacitor CT and thus a gradual charging thereof.

When the MOS capacitor CT is charged to a predetermined voltage level, an inverter 161 formed by transistors Q8 and Q9 operates, and the output of the inverter being "L" is then applied to a NOR gate circuit 171 formed by transistors Q10, Q11, Q12 and Q13.

The output $D017$ of the NOR gate circuit 171 is "H" and a switching transistor Q4 is turned ON, and thus a charge stored in the capacitor C is discharged through the switching transistor Q4. In this case, the discharge, i.e., the trailing of the output data, is done with a time shift at each output terminal D(OUT)1 to D(OUT)n. Since each delay circuit 151 in each output buffer is provided with a different time constant from each other, leading to a difference in timing of turn-on of the transistor Q4 in each output buffer. Therefore, as can be seen in FIG. 2, the variation $\Delta H$ of the potential level of the ground side power source line is small and slow.

The bottom part of FIG. 2 shows a comparison between the present invention and the prior art. Due to the time shift discharge, comparatively little peak current flows, and in response, the height $\Delta H$ of the rise of ground side source potential $V_{SS}$ is low. Whereas, in the prior art, a rush current flows and the corresponding rise of ground side source potential $V_{SS}'$ is abrupt and high.

In a similar manner as explained above, read-out data $D_2, \ldots D_n$ are transferred in parallel from the memory cell array to flip-flops, delivered by a trigger pulse $\phi$ to each inverters 121, ... 12n, then transferred to each of the output buffers BOT(1), BOT(2), ... BOT(n), and the data outputs D(OUT)1, ... D(OUT)n are retrieved.

The timing scheme in each buffer circuit in the device of FIGS. 1A and 1B as follows.

In the device of FIG. 1, assuming that the positive side power source potential level is $V_{CC}$, when the output of the output stage 121 changes from "H" to "L", the output voltage V in the delay circuit 151 is approximately expressed by the equation, $$V = V_{CC}(1 - e^{-t/T}),$$

where T is a time constant in the delay circuit. Next, assuming that the voltage inverted by an inverter is $V_{INV}$, then the discharge delay time t of the capacitor in the load is expressed by the equation $$t = -T \ln(1 - V_{INV}/V_{CC}).$$

Accordingly, because of the variation of the time constant T of the delay circuit, the time at which a capacitor C is discharged, where the capacitor C is located at each of the output terminals D(OUT)1 to D(OUT)n, can be controlled.

In order to achieve the above-decribed operation, the device of FIGS. 1A and 1B provides the output stages to which the loads including capacitance are connected, and the output buffer circuits connected to the output stages and having the output switching circuits, the inverter circuits, the delay circuits, and NOR gates. The time-divisional discharge of the capacitor is attained by the output switching circuit including the transistors Q3 and Q4 and the delay circuits.

Figure 4:
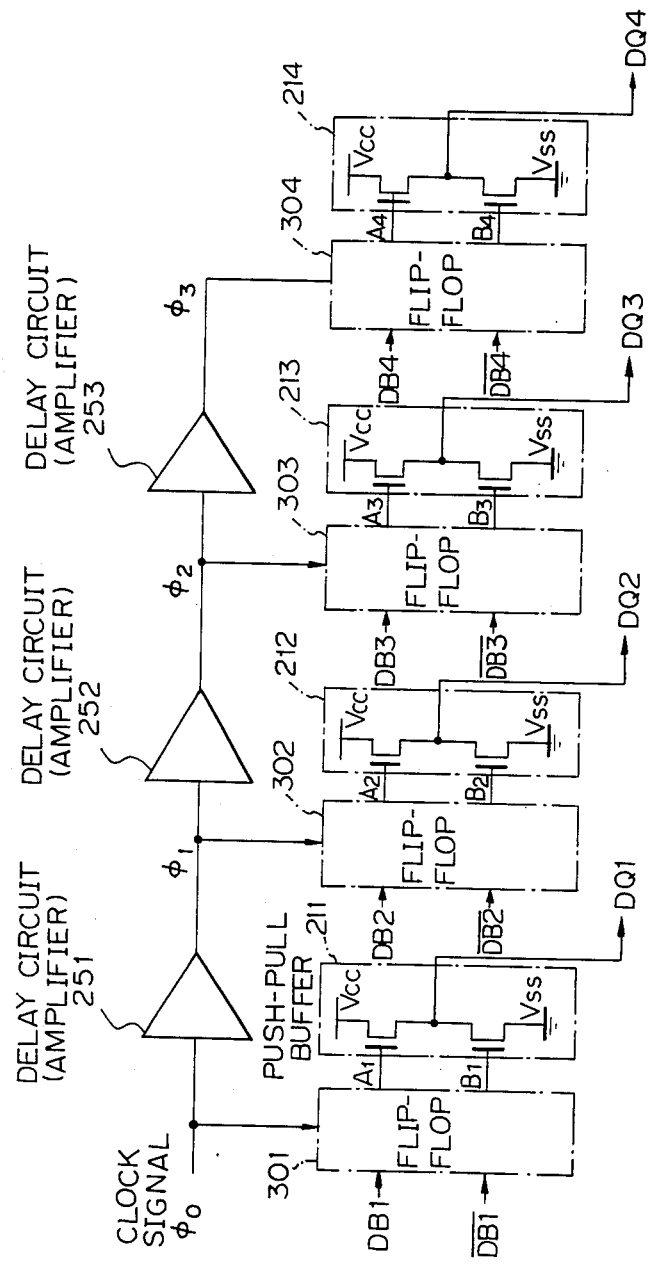
FIG. 4 is a block diagram of a semiconductor memory device according to another embodiment of the present invention.

A semiconductor memory device according to another embodiment of the present invention is shown in FIG. 4. This embodiment is particularly suitable for n-channel dynamic MOS memory devices.

In FIG. 4, 301, 302, 303, 304 are flip-flops, DB1, $\overline{DB1}$, DB2, $\overline{DB2}$, DB3, $\overline{DB3}$, and DB4, $\overline{DB4}$ are pairs of input terminals, 211, 212, 213 and 214 push-pull buffers, DQ1, DQ2, DQ3 and DQ4 outputs, 251, 252 and 253 delay circuits, and $\phi_0, \phi_1, \phi_2,$ and $\phi_3$ trigger pulses or clock inputs. $V_{CC}$ denotes a positive side power source voltage, and $V_{SS}$ the ground side voltage. All the transistors depicted are of n-channel type.

Each memory or flip-flop 301 to 304 is activated to latch data input through the input terminal by a clock pulse $\phi_0, \ldots \phi_3$. The flip-flops 301, ... 304 drive the push-pull buffers 211 to 214, respectively, only while activated. Otherwise, the push-pull buffers 211 to 214 are maintained in a high impedance (High-Z) state.

Details of the operation of FIG. 4 will be described with reference to FIG. 5. Each clock pulse $\phi_0, \phi_1, \phi_2,$ and $\phi_3$ is applied to the flip-flops 301, ... 304 with a definite time delay, and then the output of the flip-flop 301, that is, $A_1$ or $B_1$, $A_2$ or $B_2$, $A_3$ or $B_3$, and $A_4$ or $B_4$, is generated and delivered to the push-pull buffers 211 to 214.

Figure 5:
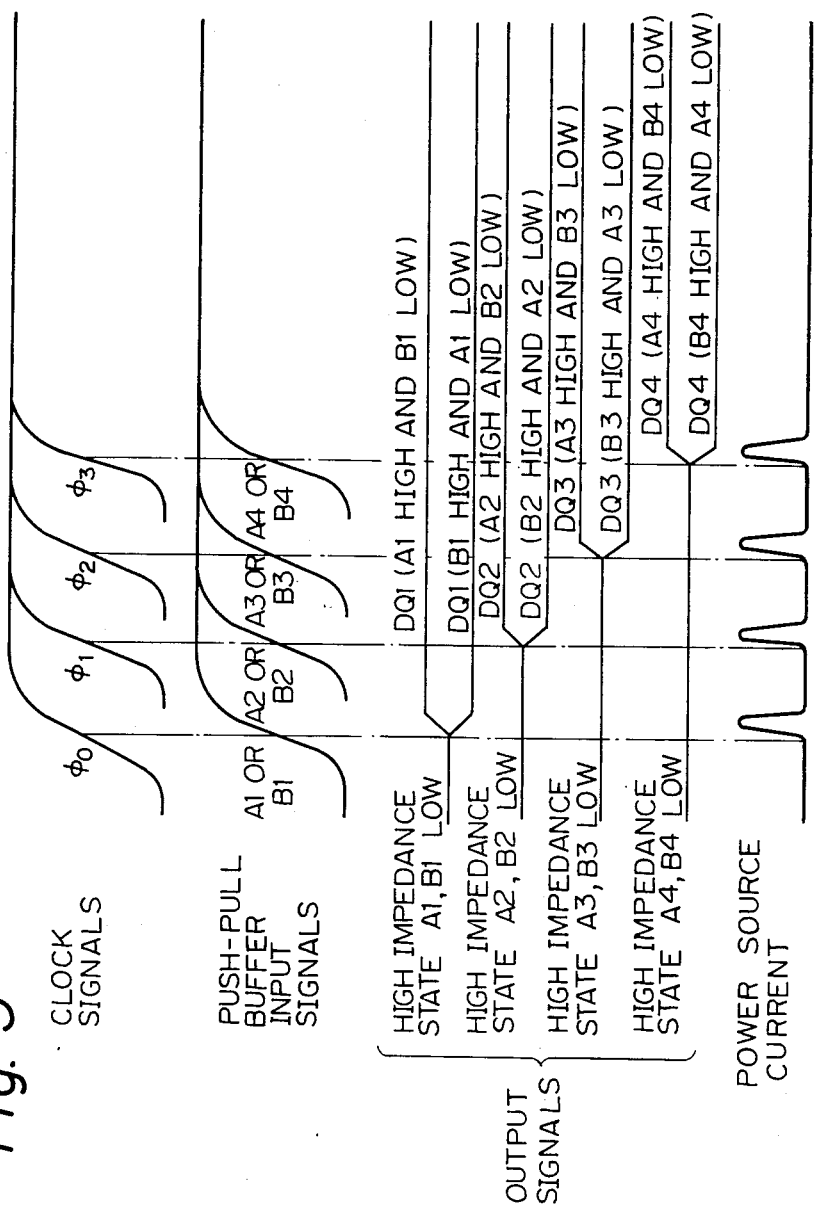
FIG. 5 is a timing chart of the voltage and current of clock pulses, memory output signals, and power source current in FIG. 4.

The waveform of the outputs DQ1 to DQ4 of each buffer 211 to 214 is shown in FIG. 5. At the input terminal of each output stage, a delay circuit 251, 252, and 253, the delay times of which are different, is interposed therebetween. There are three states of output waveforms, i.e., High, Low, and High-Z. When the flip-flop 301 is disabled, both A1 and B1 are low and the buffer 211 is in High-Z state. When $\phi_0$ is input, then A1 becomes High and B1 becomes Low, or B1 becomes High, and A1 becomes Low in correspondence with the read-out data. Accordingly, the input terminals $A_1$ or $B_1$, $A_2$ or $B_2$, $A_3$ or $B_3$, and $A_4$ or $B_4$ in the output stage or in the buffer stages 211 to 214 are raised and all the times at which the outputs appear are time-shifted. Accordingly, a large current cannot flow each time from the power source, and the peak current is divided into $1/(n+1)$, where n is the number of delay circuits. Thus, a noise or disturbance signal due to a rush current is not superimposed on the power source line and accordingly, the possibility of a malfunction of the memory circuit and associated circuits is reduced.

In the device of FIG. 4, delay circuits having different time constants are provided, and thus the semiconductor memory device according to the present invention is provided with the ability of interposing each delay circuit with a different time constant on the input terminal sides of the output stages of multi-bit type, to start the operation of data outputs at separate times from each output stage.

Due to the above-described construction, if the memory device includes a multi-bit output stage, rush current does not flow when the data is output, thus eliminating the risk that a malfunction will occur in the memory or an associated circuit.

Figure 3:
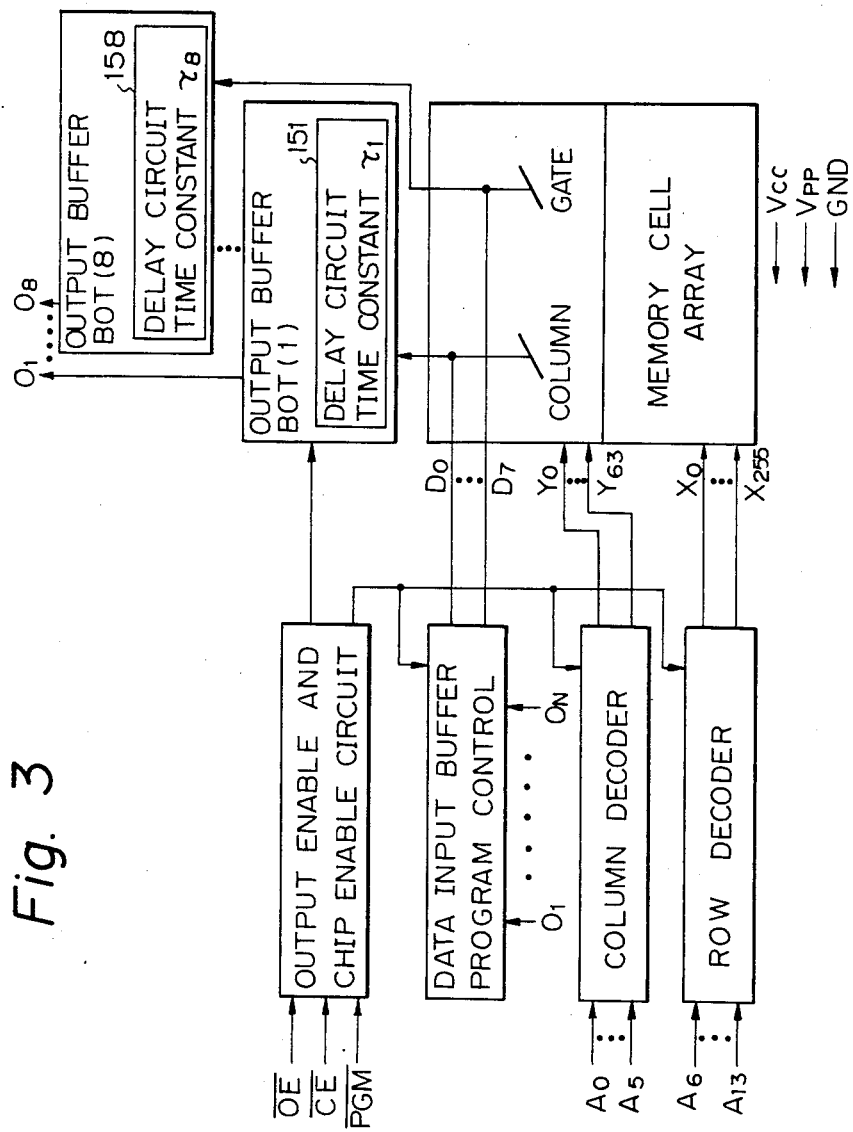
FIG. 3 shows an example of the semiconductor memory device including the structure of FIG. 1.
Figures 6, 6A:
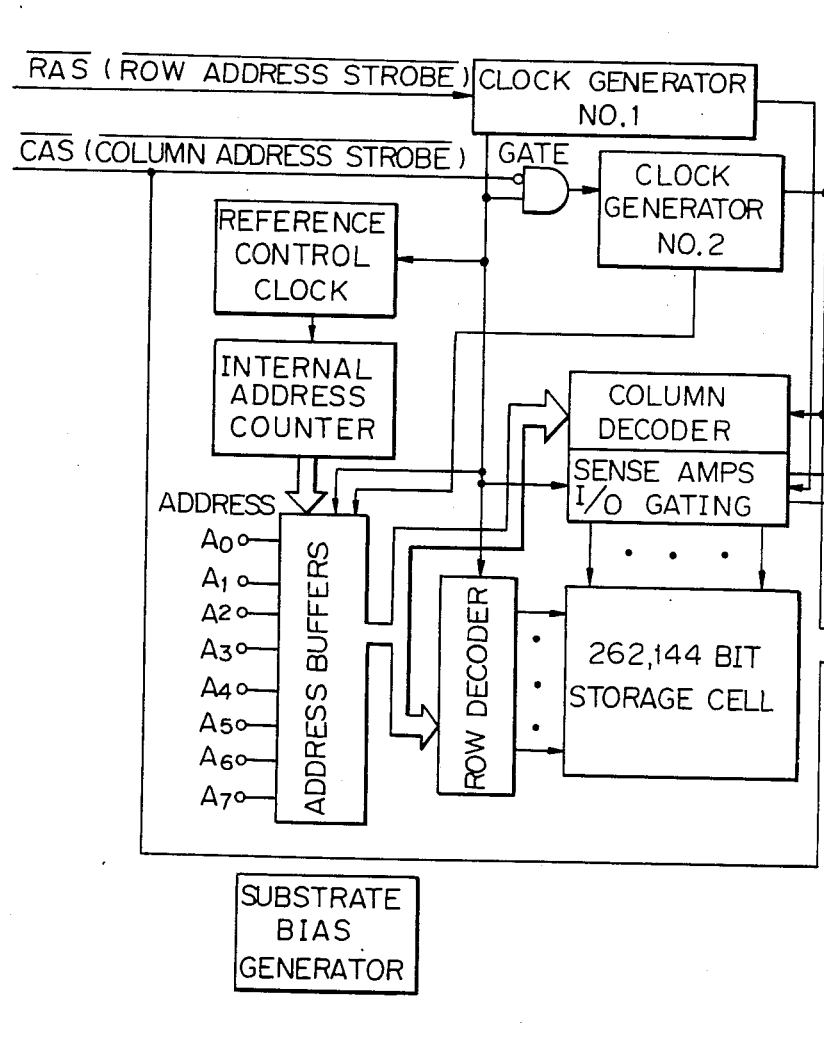
FIGS. 6A and 6B show an example of a semiconductor memory device including the structure of FIG. 4.
Figure 6B:
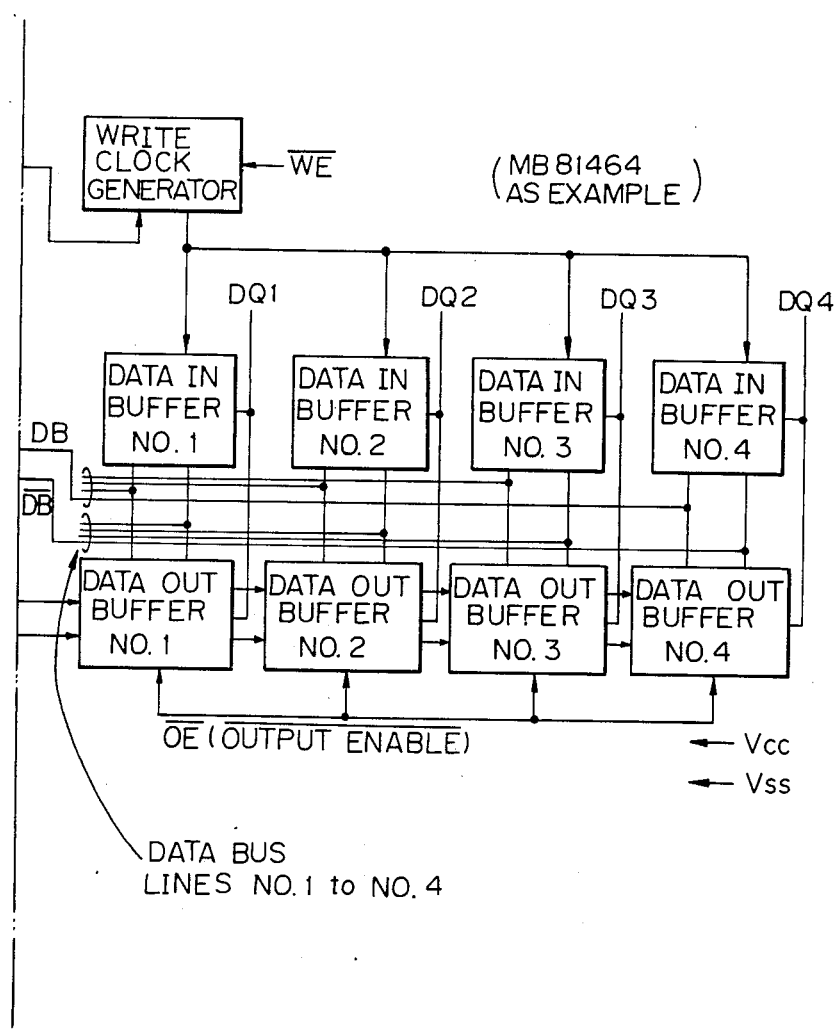

FIGS. 6A, 6B and 3 are block diagrams giving details of the embodiments shown in FIGS. 1 and 4. FIG. 6A is a block diagram of a dynamic RAM (DRAM). The output of the DRAM is done by the multi-bit type buffers for data output. A row address strobe $\overline{RAS}$ is input to a clock generator No. 1 and a column address strobe $\overline{CAS}$ is introduced into a clock generator No. 2 through a gate. The outputs of the clock generators No. 1 and No. 2 are sent to address buffers, and another output of the clock generator No. 1 drives a reference control clock and the output is counted by an internal refresh address counter, the count output is then delivered to the address buffer. These are used only in the refresh mode and the explanation is omitted. Two sets of predetermined eight address $A_0$ to $A_7$ are applied to the address buffer by the control of the strobe signals $\overline{RAS}$ and $\overline{CAS}$ and the two outputs are generated. One output is sent to a column decoder and the other to a row decoder. The address is stored in a 262,144-bit storage which has a format of 64K words×4 bits. On the other hand, a write enable signal $\overline{WE}$ drives a write clock generator and the output is distributed among the data-in buffers No. 1 to No. 4. The output of the clock generator No. 1 is sent to sense amplifiers and the outputs thereof are fed to data-in buffers No. 1 to No. 4. The output of the clock generator No. 2 are sent to a column decoder and data-out buffer No. 1. The output enable signals are delivered to the data-out buffers No. 1 to No. 4. Thus, the outputs of the data-out buffers are retrieved through the external pins as the output. In this case, the delay circuits are, respectively, connected to the data out buffers. The function of the delay circuits is the same as in FIG. 1A.

FIG. 3 is a block diagram of an EPROM using output delay circuits with a different time constant, as a second embodiment according to the present invention.

An output enable signal $\overline{OE}$ and a chip enable signal $\overline{CE}$ are input to an output enable and chip enable circuit and the output is delivered to a data input buffer, a column decoder, a row decoder, and output buffers No. 1 to No. 8. The outputs of a column and row decoder are sent to a memory cell array, and the address is assigned. The output read out from the memory cell array is delivered to output buffers No. 1 to No. 8 and outputs in response to a predetermined time constant are provided. Thus, to begin the operation of data output at a separate time from each output stage, each delay circuit is interposed on the input terminal sides of the output stages of the multi-bit type buffer, and rush current is divided into the currents passing through the number of delay circuits added by one. Accordingly, malfunctioning of the device is prevented.

We claim:

1. A multi-bit semiconductor memory device having a plurality of output buffer circuits, each of said output buffer circuits comprising:
   a data output terminal;
   an output switching means for pulling up a potential of said data output terminal to a HIGH level;
   a charge discharging switching means for pulling down the potential of said data output terminal to a LOW level;
   driving means for driving said output switching means to respond to read-out data; and
   delay means connected between a drive terminal connected with said output switching means and said charge discharging switching means;
   wherein said charge discharging switching means carries out a pull-down operation in response to an output of said delay means, each said delay means of said output buffer circuits provides different delay times from each other, so that the timings of pull-down operations in said output buffer circuits are shifted with each other.

2. A device according to claim 1, wherein said output buffer circuits comprise complementary MOS transistor inverters.

3. A device according to claim 1, wherein said output buffer circuits comprise push-pull buffer circuits.

* * * * *